US011961872B2

(12) United States Patent
Cha et al.

(10) Patent No.: US 11,961,872 B2
(45) Date of Patent: Apr. 16, 2024

(54) UNIT PIXEL HAVING LIGHT EMITTING DEVICES AND DISPLAY APPARATUS HAVING THE SAME

(71) Applicant: SEOUL VIOSYS CO., LTD., Gyeonggi-do (KR)

(72) Inventors: Namgoo Cha, Gyeonggi-do (KR); Sang Min Kim, Gyeonggi-do (KR); Jae Hee Lim, Gyeonggi-do (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 268 days.

(21) Appl. No.: 17/242,911

(22) Filed: Apr. 28, 2021

(65) Prior Publication Data

US 2021/0343782 A1 Nov. 4, 2021

Related U.S. Application Data

(60) Provisional application No. 63/017,375, filed on Apr. 29, 2020.

(51) Int. Cl.

| | |
|---|---|
| ***H01L 27/15*** | (2006.01) |
| ***H01L 25/075*** | (2006.01) |
| ***H01L 27/02*** | (2006.01) |
| ***H01L 33/62*** | (2010.01) |

(52) U.S. Cl.
CPC ........ *H01L 27/156* (2013.01); *H01L 25/0753* (2013.01); *H01L 27/0255* (2013.01); *H01L 33/62* (2013.01)

(58) Field of Classification Search
CPC ............... H01L 27/156; H01L 25/0753; H01L 27/0255; H01L 33/62; H01L 25/167; H01L 27/0292
See application file for complete search history.

(56) References Cited

U.S. PATENT DOCUMENTS

| | | | | |
|---|---|---|---|---|
| 2010/0213496 | A1* | 8/2010 | Chen | H01L 25/167 257/E33.066 |
| 2011/0248293 | A1 | 10/2011 | Chan et al. | |
| 2019/0148346 | A1* | 5/2019 | Feichtinger | H05K 1/0259 361/760 |

FOREIGN PATENT DOCUMENTS

| | | | |
|---|---|---|---|
| KR | 20050076680 | * | 7/2005 |
| KR | 1020050076680 | A | 7/2005 |
| KR | 1020160035180 | A | 3/2016 |
| KR | 101783955 | B1 | 10/2017 |
| KR | 101789126 | B1 | 10/2017 |

OTHER PUBLICATIONS

International Search Report for International Application No. PCT/KR2021/005485, dated Aug. 19, 2021, English Translation, 2 pages.

* cited by examiner

*Primary Examiner* — Ratisha Mehta
(74) *Attorney, Agent, or Firm* — Perkins Coie LLP

(57) ABSTRACT

A unit pixel includes a transparent substrate, a plurality of light emitting devices disposed on the transparent substrate, and an electrostatic discharge (ESD) protector disposed on the transparent substrate and protecting at least one of the light emitting devices from electrostatic discharge.

20 Claims, 12 Drawing Sheets

10a
59a 61 53 27 59 59b 63 55 25 23 M 21

UNIT PIXEL HAVING LIGHT EMITTING DEVICES AND DISPLAY APPARATUS HAVING THE SAME

CROSS-REFERENCE OF RELATED APPLICATIONS AND PRIORITY

The Present application is a Non-provisional application which claims priority to and the benefit of U.S. Provisional Application No. 63/017,375 filed Apr. 29, 2020, the disclosure of which is incorporated by reference in its entirety.

TECHNICAL FIELD

Exemplary embodiments relate to a unit pixel having light emitting devices and a display apparatus having the same, and more particularly, to a unit pixel having an electrostatic discharge protection function and a display apparatus having the same.

BACKGROUND

Light emitting devices are semiconductor devices using light emitting diodes which are inorganic light sources, and are used in various technical fields such as display apparatuses, automobile lamps, general lighting, and the like. Light emitting diodes have more advantages such as longer lifespan, lower power consumption, and faster response, than existing light sources, and thus, light emitting diodes have been replacing the existing light sources.

Conventional light emitting diodes have been generally used as backlight light sources in display apparatuses. However, display apparatuses that directly realize images using the light emitting diodes have been recently developed. Such displays are also referred to as micro LED displays.

In general, the display apparatus displays various colors through mixture of blue light, green light, and red light. In order to realize various images, the display apparatus includes a plurality of pixels, each including sub-pixels corresponding to one of blue, green, and red light. As such, a color of a certain pixel is typically determined based on the colors of the sub-pixels, so that images can be realized through the combination of such pixels.

In the case of the micro LED display, a micro LED is arranged on a two-dimensional plane corresponding to each sub pixel, and, accordingly, a large number of micro LEDs need to be arranged on a single substrate. However, the micro LED has a very small area, for example, about 10,000 $\mu m^2$ or less. Due to the small size, it is difficult to handle the micro LEDs, and thus, it is not easy to mount the micro LEDs on a display panel, especially when millions or tens of millions of micro LEDs need to be transferred and mounted on a display panel. Moreover, the micro LEDs can be damaged by external shock, and can also be damaged by electrostatic discharge (ESD). In particular, the small size of the micro LEDs makes the micro LEDs more susceptible to electrostatic discharge. Accordingly, it would be desirable to avoid occurrence of physical shocks during transport or other factors such as the ESD in the micro LEDs.

SUMMARY

Exemplary embodiments provide a unit pixel facilitating handling of micro LEDs and a display apparatus having the same.

Exemplary embodiments provide a unit pixel capable of preventing micro LEDs from being damaged by external shock or electrostatic discharge, and a display apparatus having the same.

A unit pixel according to one or more exemplary embodiments includes a transparent substrate, a plurality of light emitting devices disposed on the transparent substrate, and an electrostatic discharge (ESD) protector disposed on the transparent substrate, and protecting at least one of the light emitting devices from electrostatic discharge.

A display apparatus according to one or more exemplary embodiments includes a circuit board and a unit pixel disposed on the circuit board. The unit pixel includes a transparent substrate, a plurality of light emitting devices disposed on the transparent substrate, and an electrostatic discharge (ESD) protector disposed on the transparent substrate, and protecting at least one of the light emitting devices from electrostatic discharge.

DETAILED DESCRIPTION OF THE ILLUSTRATED EMBODIMENTS

Figure 1:
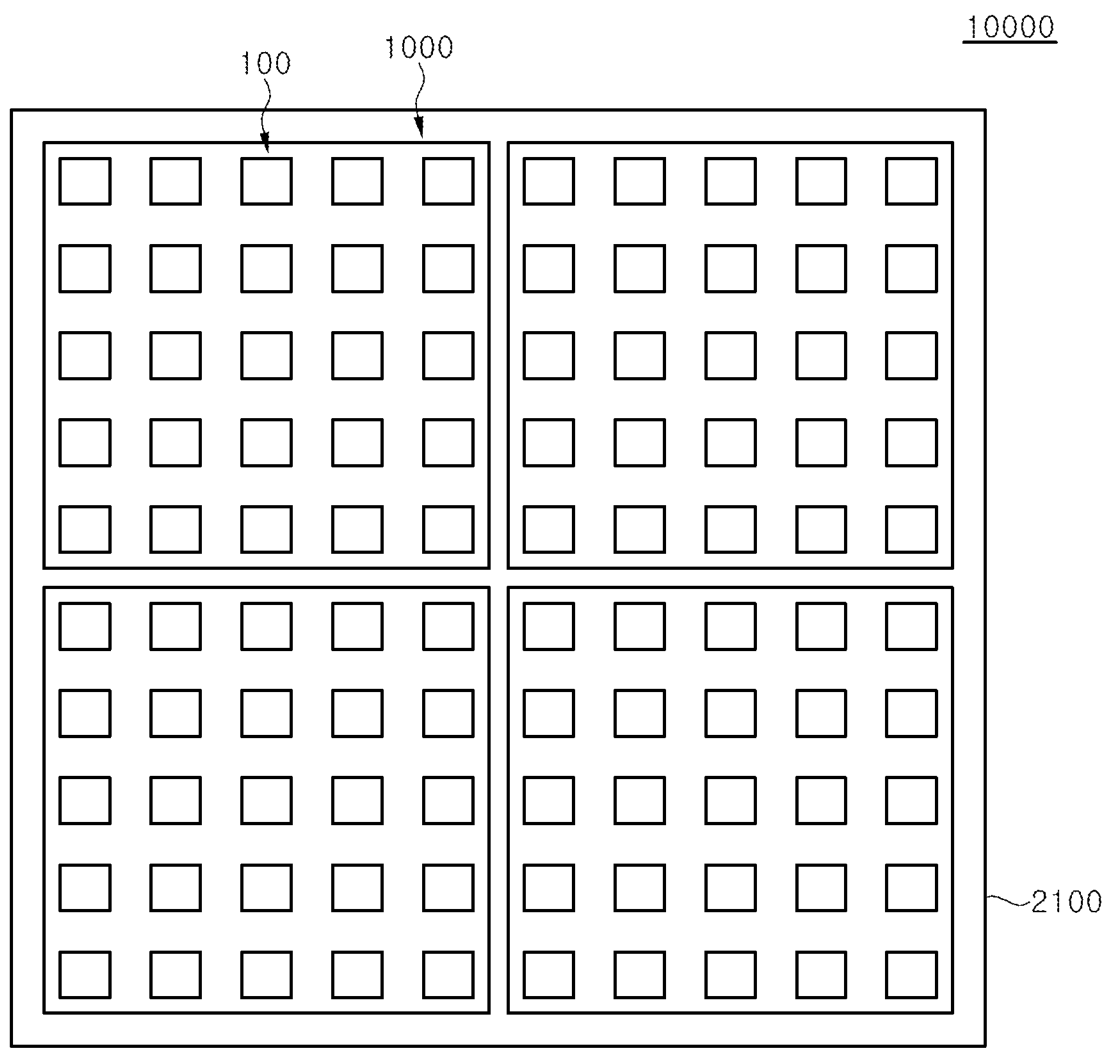
FIG. 1 is a schematic plan view illustrating a display apparatus according to an exemplary embodiment.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

A unit pixel according to one or more exemplary embodiments includes a transparent substrate, a plurality of light emitting devices disposed on the transparent substrate, and an electrostatic discharge (ESD) protector disposed on the transparent substrate, and protecting at least one of the light emitting devices from electrostatic discharge.

In at least one variant, the ESD protector may include a conductive line extending along an edge of the transparent substrate. The conductive line may surround the light emitting devices.

In another variant, the unit pixel may further include connection layers electrically connected to the light emitting devices, and the conductive line may be electrically connected to one of the connection layers. In addition, the conductive line may surround the connection layers. Further, the connection layers may include a common connection layer commonly electrically connected to the light emitting devices, and the conductive line may be electrically connected to the common connection layer.

In further another variant, the common connection layer may be electrically connected to n-type semiconductor layers of the light emitting devices.

Meanwhile, the ESD protector may include a plurality of conductive lines, and the conductive lines may be electrically connected to the connection layers, respectively. The ESD protector may include at least one Zener diode, and the Zener diode may be electrically connected to at least one of the light emitting devices.

In further another variant, the unit pixel may further include connection layers electrically connected to the light emitting devices, and the Zener diode may be electrically connected to two connection layers of the connection layers. Furthermore, the ESD protector may further include a conductive line extending along the edge of the transparent substrate. The unit pixel may further include connection layers electrically connected to the light emitting devices, in which the conductive line may be electrically connected to one of the connection layers, and the Zener diode may be electrically connected to two of the connection layers.

In further another variant, the conductive line may surround the connection layers. Further, the connection layers may include a common connection layer commonly electrically connected to the light emitting devices, and the conductive line may be electrically connected to the common connection layer. The common connection layer may be electrically connected to n-type semiconductor layers of the light emitting devices. The ESD protector may include a plurality of conductive lines, and the conductive lines may be electrically connected to the connection layers, respectively.

A display apparatus according to one or more exemplary embodiments includes a circuit board and a unit pixel disposed on the circuit board. The unit pixel includes a transparent substrate, a plurality of light emitting devices disposed on the transparent substrate, and an electrostatic discharge (ESD) protector disposed on the transparent substrate, and protecting at least one of the light emitting devices from electrostatic discharge.

In at least one variant, the ESD protector may include a conductive line extending along an edge of the transparent substrate. In some forms, the conductive line may be commonly electrically connected to the light emitting devices. Additionally, or alternatively, the ESD protector may include a Zener diode, and the Zener diode may be electrically connected to at least one of the light emitting devices.

Hereinafter, exemplary embodiments will be described in detail with reference to the accompanying drawings.

Figure 2:
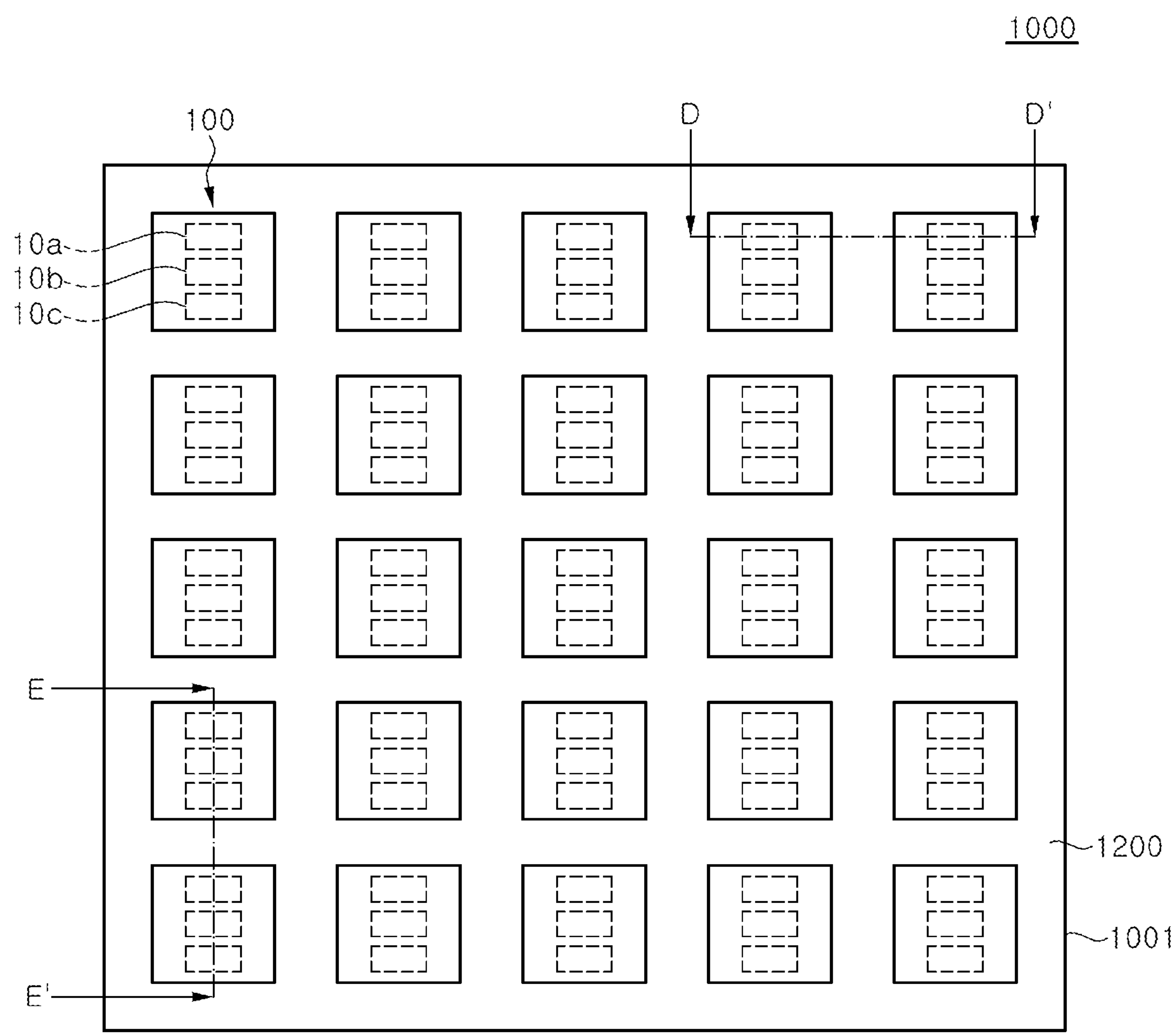
FIG. 2 is a schematic plan view illustrating a pixel module according to an exemplary embodiment.

FIG. 1 is a schematic plan view illustrating a display apparatus 10000 according to an exemplary embodiment, and FIG. 2 is a schematic plan view illustrating a pixel module 1000 according to an exemplary embodiment.

Referring to FIG. 1 and FIG. 2, the display apparatus 10000 may include a panel substrate 2100 and a plurality of pixel modules 1000.

The display apparatus 10000 is not particularly limited, but it may include a VR display apparatus such as a micro LED TV, a smart watch, a VR headset, or an AR display apparatus such as augmented reality glasses.

The panel substrate 2100 may include a circuit for passive matrix driving or active matrix driving. In some forms, the panel substrate 2100 may include interconnection lines and resistors therein, and in another form, the panel substrate 2100 may include interconnection lines, transistors, and capacitors. The panel substrate 2100 may also have pads that are capable of being electrically connected to the disposed circuit on an upper surface thereof.

In some forms, the plurality of pixel modules 1000 is arranged on the panel substrate 2100. As shown in FIG. 2, each of the pixel modules 1000 may include a circuit board 1001, a plurality of unit pixels 100 disposed on the circuit board 1001, and a molding member 1200 covering the unit pixels 100. In other forms, the plurality of unit pixels 100 may be directly arranged on the panel substrate 2100, and the molding member 1200 may cover the unit pixels 100.

Each of the unit pixels 100 includes a plurality of light emitting devices 10*a*, 10*b*, and 10*c*, as shown in FIG. 2. The light emitting devices 10*a*, 10*b*, and 10*c* may emit light of different colors from one another. The light emitting devices 10*a*, 10*b*, and 10*c* in each of the unit pixels 100 may be arranged in a line as illustrated in FIG. 2. In some forms the light emitting devices 10*a*, 10*b*, and 10*c* may be arranged in the vertical direction with respect to a display screen on which an image is implemented. However, the inventive concepts are not limited thereto, and in other forms, the light emitting devices 10*a*, 10*b*, and 10*c* may be arranged in a lateral direction with respect to the display screen on which the image is implemented.

The light emitting devices 10*a*, 10*b*, and 10*c* are directly mounted on the panel substrate 2100 and mounting failure of light emitting devices may occur. In this case, the panel substrate 2100 and all of the light emitting devices may be discarded, resulting in significant cost loss. Meanwhile, after the unit pixels 100 on which the light emitting devices 10*a*, 10*b*, and 10*c* are mounted are manufactured first, unit pixels 100 in good condition are selected to be mounted on the panel substrate 2100, and thus, cost loss caused by the failed device may be reduced.

Furthermore, as the unit pixel 100, is used instead of directly handling the light emitting devices 10*a*, 10*b*, and 10*c*, the light emitting devices 10*a*, 10*b*, and 10*c* may be easily mounted accordingly. In addition, the light emitting devices 10*a*, 10*b*, and 10*c* are disposed in the unit pixel 100 and therefore, it is possible to prevent the light emitting devices 10*a*, 10*b*, and 10*c* from being damaged by an external impact.

Hereinafter, each element of the display apparatus 10000 will be described in detail in the order of the light emitting devices 10*a*, 10*b*, and 10*c*, the unit pixel 100, and the pixel module 1000 that are disposed in the display apparatus 10000.

Figure 3A:
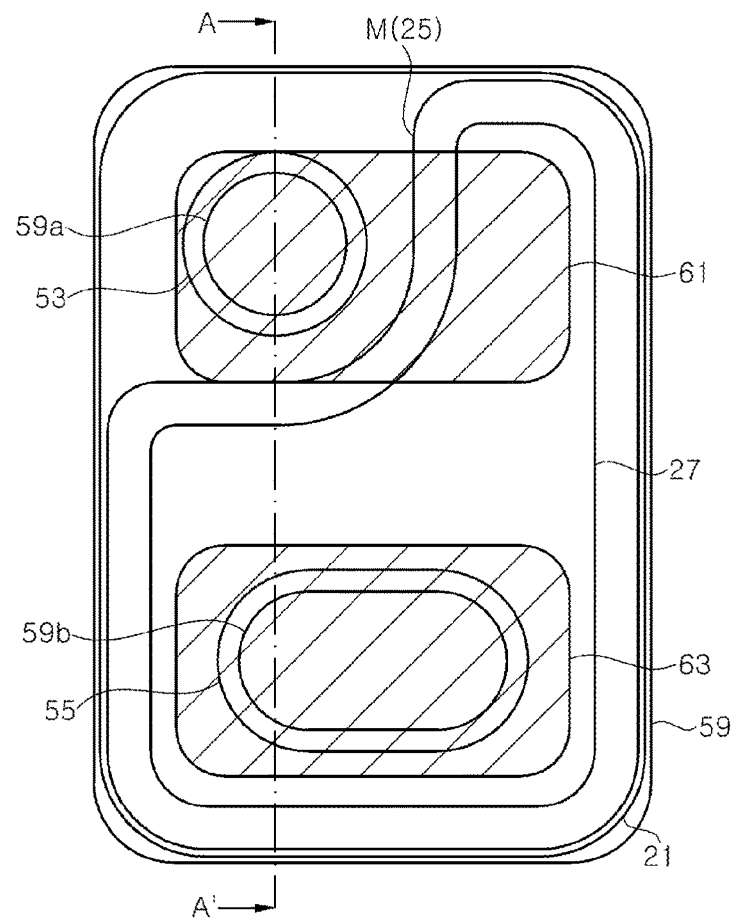
FIG. 3A is a schematic plan view illustrating a light emitting device according to an exemplary embodiment.
Figure 3B:
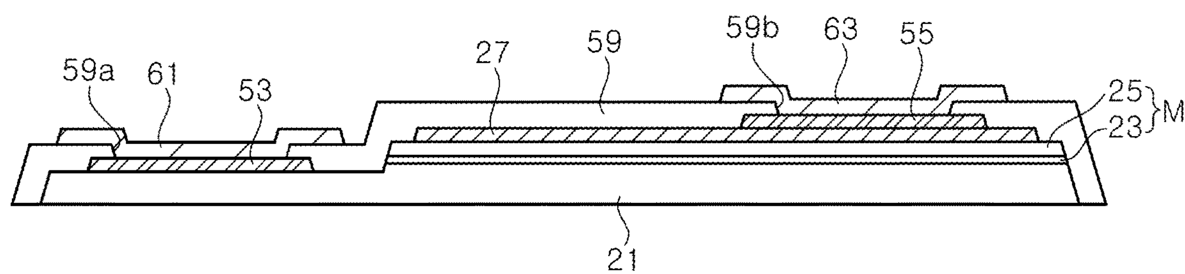
FIG. 3B is a schematic cross-sectional view taken along line A-A' of FIG. 3A.

First, FIG. 3A is a schematic plan view illustrating the light emitting device 10*a* according to an exemplary embodiment, and FIG. 3B is a schematic cross-sectional view taken along line A-A of FIG. 3A. Herein, although the light emitting device 10*a* will be described as an example, since the light emitting devices 10*b* and 10*c* have substantially similar structures, repeated descriptions thereof will be omitted.

Referring to FIGS. 3A and 3B, the light emitting device 10*a* includes a light emitting structure including a first conductivity type semiconductor layer 21, an active layer 23, and a second conductivity type semiconductor layer 25, an ohmic contact layer 27, a first contact pad 53, a second contact pad 55, an insulation layer 59, a first electrode pad 61, and a second electrode pad 63.

The light emitting device 10*a* may have a rectangular shape having a long axis and a short axis as viewed in plan view. For example, a length of the long axis may have a size of 100 μm or less, and a length of the short axis may have a size of 70 μm or less. The light emitting devices 10*a*, 10*b*, and 10*c* may have substantially similar shapes and sizes to one another.

The light emitting structure, that is, the first conductivity type semiconductor layer 21, the active layer 23, and the second conductivity type semiconductor layer 25 may be grown on a substrate. The substrate may be one of various substrates that are used to grow semiconductors, such as a gallium nitride substrate, a GaAs substrate, a Si substrate, a sapphire substrate, especially a patterned sapphire substrate. The growth substrate may be separated from the semiconductor layers using a process such as a mechanical grinding, a laser lift off, a chemical lift off process, or the like. However, the inventive concepts are not limited thereto, and, in some exemplary embodiments, a portion of the substrate may remain to constitute at least a portion of the first conductivity type semiconductor layer 21.

When the light emitting device 10*a* emits red light according to an exemplary embodiment, the semiconductor layers may include aluminum gallium arsenide (AlGaAs), gallium arsenide phosphide (GaAsP), aluminum gallium indium phosphide (AlGaInP), or gallium phosphide (GaP).

When the light emitting device 10*b* emits green light according to an exemplary embodiment, the semiconductor layers may include indium gallium nitride (InGaN), gallium nitride (GaN), gallium phosphide (GaP), aluminum gallium indium phosphide (AlGaInP), or aluminum gallium phosphide (AlGaP).

When the light emitting device 10*c* emits blue light according to an exemplary embodiment, the semiconductor layers may include gallium nitride (GaN), indium gallium nitride (InGaN), or zinc selenide (ZnSe).

The first conductivity type and the second conductivity type have opposite polarities, when the first conductivity type is an n-type, the second conductivity type becomes a p-type, and, when the first conductivity type is a p-type, the second conductivity type becomes an n-type.

The first conductivity type semiconductor layer 21, the active layer 23, and the second conductivity type semiconductor layer 25 may be grown on the substrate in a chamber using a known process such as metal organic chemical vapor deposition (MOCVD) process. In addition, the first conductivity type semiconductor layer 21 includes n-type impurities (e.g., Si, Ge, and Sn), and the second conductivity type semiconductor layer 25 includes p-type impurities (e.g., Mg, Sr, and Ba). In the case of the light emitting device 10*b* or 10*c* emitting green or blue light, the first conductivity type semiconductor layer 21 may include GaN or AlGaN containing Si as a dopant, and the second conductivity type semiconductor layer 25 may include GaN or AlGaN containing Mg as a dopant.

Although the first conductivity type semiconductor layer 21 and the second conductivity type semiconductor layer 25 are shown as single layers in FIGS. 3A and 3B, these layers may be multiple layers, and may also include a superlattice layer. The active layer 23 may include a single quantum well structure or a multiple quantum well structure, and a composition ratio of a compound semiconductor may be adjusted to emit a desired wavelength. For example, the active layer 23 may emit blue light, green light, red light, or ultraviolet light.

The second conductivity type semiconductor layer 25 and the active layer 23 may have a mesa M structure and may be disposed on the first conductivity type semiconductor layer 21. The mesa M may include the second conductivity type semiconductor layer 25 and the active layer 23, and may include a portion of the first conductivity type semiconductor layer 21 as illustrated in FIG. 3B. The mesa M may be disposed on the portion of the first conductivity type semiconductor layer 21, and an upper surface of the first conductivity type semiconductor layer 21 may be exposed around the mesa M.

In the illustrated exemplary embodiment, the mesa M is formed so as to expose the first conductivity type semiconductor layer 21 around it. In another exemplary embodiment, a through hole may be formed through the mesa M to expose the first conductivity type semiconductor layer 21.

In an exemplary embodiment, the first conductivity type semiconductor layer 21 may have a flat light exiting surface. In another exemplary embodiment, the first conductivity type semiconductor layer 21 may have a concave-convex pattern by surface texturing on a side of the light exiting surface. Surface texturing may be carried out by patterning, for example, using a dry or wet etching process. For example, cone-shaped protrusions may be formed on the light exiting surface of the first conductivity type semiconductor layer 21, a height of the cone may be about 2 μm to about 3 μm, a distance between the cones may be about 1.5 μm to about 2 μm, and a diameter of a bottom of the cone may be about 3 μm to about 5 μm. The cone may also be truncated, in which case an upper diameter of the cone may be about 2 μm to about 3 μm.

In another exemplary embodiment, the concave-convex pattern may include a first concave-convex pattern and a second concave-convex pattern additionally formed on the first concave-convex pattern.

As the concave-convex pattern is formed on the surface of the first conductivity type semiconductor layer 21, total internal reflection may be reduced, thereby increasing light extraction efficiency. Surface texturing may be carried out on the first conductivity type semiconductor layers of all of the first, second, and third light emitting devices 10*a*, 10*b*, and 10*c*, and thus, viewing angles of light emitted from the first, second, and third light emitting devices 10*a*, 10*b*, and 10*c* may become uniform. However, the inventive concepts are not limited thereto, and at least one of the light emitting devices 10*a*, 10*b*, and 10*c* may have the flat surface without including the concave-convex pattern.

The ohmic contact layer 27 is disposed on the second conductivity type semiconductor layer 25 to be in ohmic contact with the second conductivity type semiconductor layer 25. The ohmic contact layer 27 may be formed of a single layer or multiple layers, and may be formed of a transparent conductive oxide film or a metal film. For example, the transparent conductive oxide film may include ITO, ZnO, or the like, and the metal film may include a metal such as Al, Ti, Cr, Ni, Au, or the like and alloys thereof.

The first contact pad 53 is disposed on the exposed first conductivity type semiconductor layer 21. The first contact pad 53 may be in ohmic contact with the first conductivity type semiconductor layer 21. For example, the first contact pad 53 may be formed of an ohmic metal layer in ohmic contact with the first conductivity type semiconductor layer 21. The ohmic metal layer of the first contact pad 53 may be appropriately selected depending on a semiconductor material of the first conductivity type semiconductor layer 21. In other forms, the first contact pad 53 may be omitted.

The second contact pad 55 may be disposed on the ohmic contact layer 27. The second contact pad 55 is electrically connected to the ohmic contact layer 27. In other forms, the second contact pad 55 may be omitted.

The insulation layer 59 covers the mesa M, the ohmic contact layer 27, the first contact pad 53, and the second contact pad 55. The insulation layer 59 has openings 59*a* and 59*b* exposing the first contact pad 53 and the second contact pad 55. The insulation layer 59 may be formed as a single layer or multiple layers. Furthermore, the insulation layer 59 may include a distributed Bragg reflector in which insulation layers having different refractive indices from one another are stacked. For example, the distributed Bragg reflector may include at least two types of insulation layers selected from $SiO_2$, $Si_3N_4$, SiON, $TiO_2$, $Ta_2O_5$, and $Nb_2O_5$.

The distributed Bragg reflector reflects light emitted from the active layer 23. The distributed Bragg reflector may exhibit high reflectance over a relatively wide wavelength range including a peak wavelength of light emitted from the active layer 23, and may be designed in consideration of an incident angle of light. In an exemplary embodiment, the distributed Bragg reflector may have a higher reflectance for light incident at an incident angle of 0 degrees than that for light incident at a different incident angle. In another exemplary embodiment, the distributed Bragg reflector may have a higher reflectance for light incident at a particular incident angle than that for light incident at the incident angle of 0 degrees. For example, the distributed Bragg reflector may have a higher reflectance for light incident at an incident angle of 10 degrees than that for light incident at the incident angle of 0 degrees.

Meanwhile, the light emitting structure of the blue light emitting device 10*c* has higher internal quantum efficiency compared to those of the light emitting structures of the red light emitting device 10*a* and the green light emitting device 10*b*. Accordingly, the blue light emitting device 10*c* may exhibit higher light extraction efficiency than those of the red and green light emitting devices 10*a* and 10*b*. As such, it may be difficult to properly maintain a color mixing ratio of red light, green light, and blue light.

To adjust the color mixing ratio of red light, green light, and blue light, the distributed Bragg reflectors applied to the light emitting devices 10*a*, 10*b*, and 10*c* may be formed to have different reflectance from one another. For example, the blue light emitting device 10*c* may have the distributed Bragg reflector having a relatively low reflectance compared to those of the red and green light emitting devices 10*a* and 10*b*. For example, the distributed Bragg reflector formed in the blue light emitting device 10*c* may have a reflectance of 95% or less at the incident angle of 0 degrees for blue light generated in the active layer 23, and further 90% or less, the distributed Bragg reflector formed in the green light emitting device 10*b* may have a reflectance of about 95% or more and 99% or less at the incident angle of 0 degrees for green light, and the distributed Bragg reflector formed in the red light emitting device 10*a* may have a reflectance of 99% or more at the incident angle of 0 degrees for red light.

In an exemplary embodiment, the distributed Bragg reflectors applied to the red, green, and blue light emitting devices 10*a*, 10*b*, and 10*c* may have a substantially similar thickness. For example, a difference in thickness between the distributed Bragg reflectors applied to these light emitting devices 10*a*, 10*b*, and 10*c* may be 10% or less of a thickness of a thickest distributed Bragg reflector. By reducing the thickness difference between the distributed Bragg reflectors, process conditions applied to the red, green, and blue light emitting devices 10*a*, 10*b*, and 10*c*, for example, a process of patterning the insulation layer 59, may be similarly set, and furthermore, it is possible to prevent the unit pixel manufacturing process from becoming complex. Moreover, the distributed Bragg reflectors applied to the red, green, and blue light emitting devices 10*a*, 10*b*, and 10*c* may have a substantially similar stacking number. However, the inventive concepts are not limited thereto.

The first electrode pad 61 and the second electrode pad 63 are disposed on the insulation layer 59. The first electrode pad 61 may extend from an upper region of the first contact pad 53 to an upper region of the mesa M, and the second electrode pad 63 may be disposed in the upper region of the mesa M. The first electrode pad 61 may be connected to the first contact pad 53 through the opening 59*a*, and the second electrode pad 63 may be electrically connected to the second contact pad 55. Alternatively, the first electrode pad 61 may be directly in ohmic contact with the first conductivity type semiconductor layer 21, and in this case, the first contact pad 53 may be omitted. In other forms, when the second contact pad 55 is omitted, the second electrode pad 63 may be directly connected to the ohmic contact layer 27.

The first and/or second electrode pads 61 and 63 may be formed of a single layer or a multiple layer of metal. As a material of the first and/or second electrode pads 61 and 63, a metal such as Al, Ti, Cr, Ni, Au, or the like and an alloy thereof or the like may be used. For example, the first and second electrode pads 61 and 63 may include a Ti layer or a Cr layer at an upper most layer, and may include an Au layer thereunder.

Although the light emitting device 10*a* according to the exemplary embodiment has been briefly described with reference to FIGS. 3A and 3B, the light emitting device 10*a* may further include a layer having additional functions in addition to the above-described layers. For example, various layers such as a reflective layer for reflecting light, an additional insulation layer for insulating a specific element, and a solder preventing layer for preventing diffusion of solder may be further included.

When a flip chip type light emitting device is formed, the mesa may be formed to have various shapes, and locations and shapes of the first and second electrode pads 61 and 63 may also be variously modified, and the second contact pad 55 or the second electrode pad 63 may directly contact the second conductivity type semiconductor layer 25.

Figure 4A:
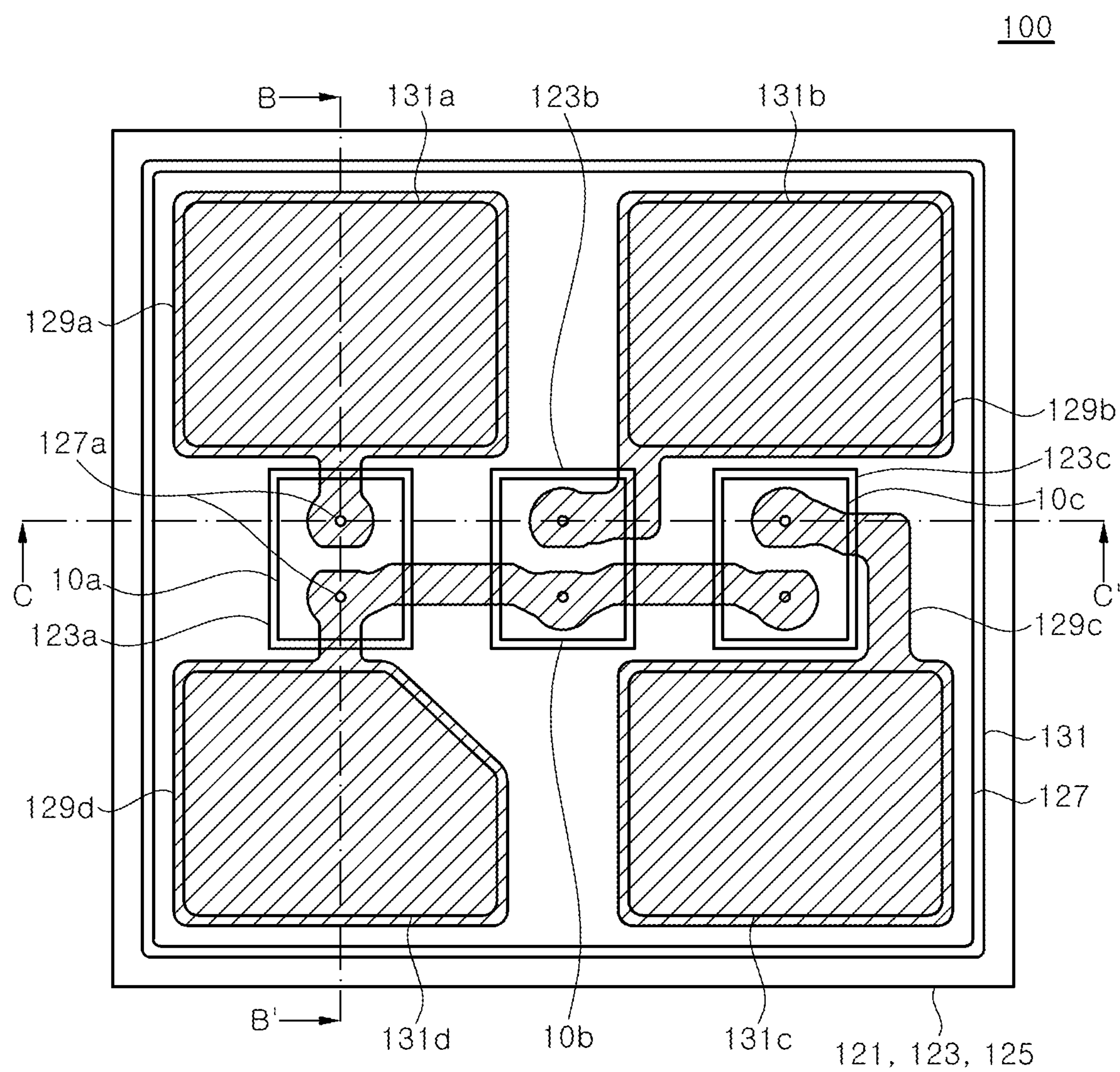
FIG. 4A is a schematic plan view illustrating a unit pixel according to an exemplary embodiment.
Figure 4B:
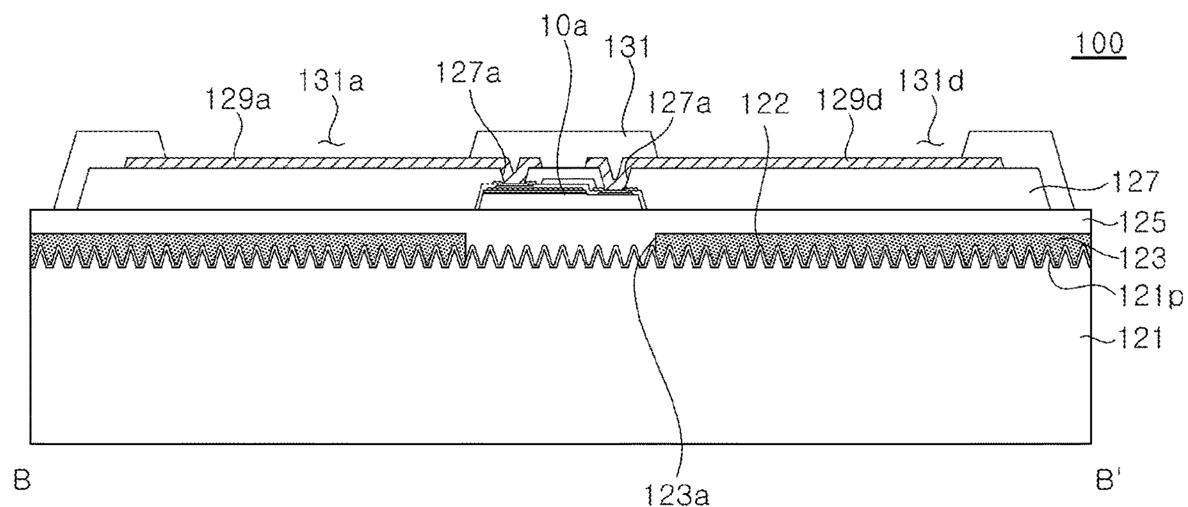
FIG. 4B is a schematic cross-sectional view taken along line B-B' of FIG. 4A.
Figure 4C:
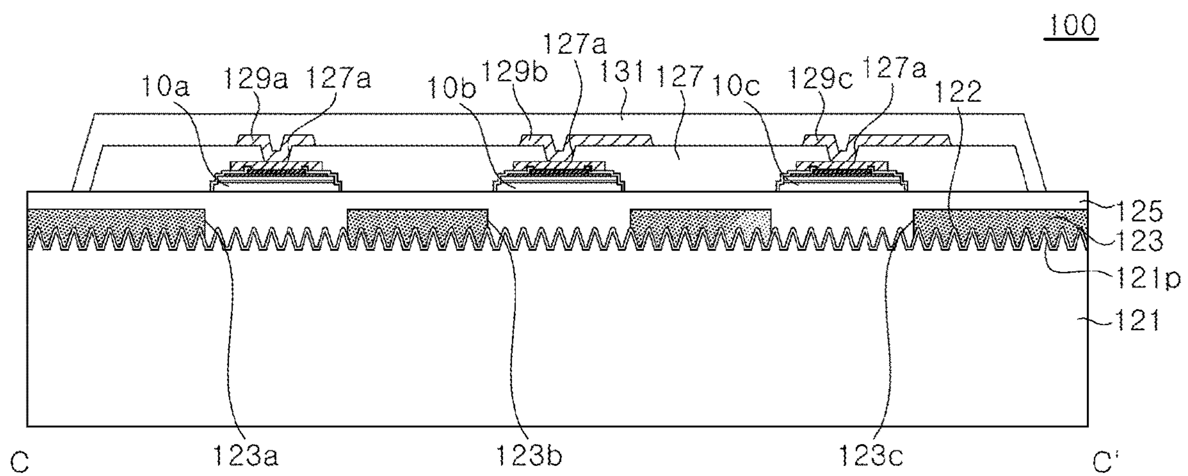
FIG. 4C is a schematic cross-sectional view taken along line C-C' of FIG. 4A.

FIG. 4A is a schematic plan view illustrating the unit pixel 100 according to an exemplary embodiment, FIG. 4B is a schematic cross-sectional view taken along line B-B' of FIG. 4A, and FIG. 4C is a schematic cross-sectional view taken along line C-C' of FIG. 4A.

Referring to FIGS. 4A, 4B, and 4C, the unit pixel 100 may include a transparent substrate 121, a first, a second, and a third light emitting devices 10*a*, 10*b*, and 10*c*, a surface layer 122, a light blocking layer 123, an adhesive layer 125, a step adjustment layer 127, connection layers 129*a*, 129*b*, 129*c*, and 129*d*, and an insulation material layer 131.

The unit pixel 100 provides a single pixel including the first, second, and third light emitting devices 10*a*, 10*b*, and 10*c*. The first, second, and third light emitting devices 10*a*, 10*b*, and 10*c* emit light of different colors, and the first, second, and third light emitting devices 10*a*, 10*b*, and 10*c* correspond to subpixels of the single pixel, respectively.

The transparent substrate 121 is a light transmissive substrate such as PET, glass substrate, quartz, sapphire substrate, or the like. The transparent substrate 121 is disposed on a light exiting surface of the display apparatus 10000 of FIG. 1, and light emitted from the light emitting devices 10*a*, 10*b*, and 10*c* is emitted to the outside through the transparent substrate 121. The transparent substrate 121 may have an upper surface and a lower surface. The transparent substrate 121 may include a concave-convex pattern 121*p* on a surface facing the light emitting devices 10*a*, 10*b*, and 10*c*, that is, the upper surface, as shown in FIGS. 4B and 4C. The concave-convex pattern 121*p* scatters light emitted from the light emitting devices 10*a*, 10*b*, and 10*c* to increase a viewing angle. In addition, light emitted from the light emitting devices 10*a*, 10*b*, and 10*c* having different viewing angle characteristics from one another may be emitted at a uniform viewing angle by the concave-convex pattern 121*p*. As such, it is possible to prevent an occurrence of color difference depending on the viewing angle.

The concavo-convex pattern 121*p* may be regular or irregular. The concavo-convex pattern 121*p* may have a pitch of about 3 μm, a diameter of about 2.8 μm, and a height of about 1.8 μm, for example. The concavo-convex pattern 121*p* may be a pattern generally applied to a patterned sapphire substrate, but it is not limited thereto.

The transparent substrate 121 may also include an anti-reflection coating, may include an anti-glare layer, or may be treated with an anti-glare treatment. The transparent substrate 121 may have a thickness of about 50 μm to about 300 μm for example.

Since the transparent substrate 121 is disposed on the light exiting surface, the transparent substrate 121 does not include a circuit. However, the inventive concepts are not limited thereto, and, in some exemplary embodiments, the transparent substrate 121 may include the circuit.

Although a single unit pixel 100 is illustrated to be formed on a single transparent substrate 121, a plurality of unit pixels 100 may be formed on the single transparent substrate 121.

The surface layer 122 covers the concave-convex pattern 121*p* of the transparent substrate 121. The surface layer 122 may be formed along a shape of the concave-convex pattern 121*p*. The surface layer 122 may improve adhesion of the light blocking layer 123 formed thereon. For example, the surface layer 122 may be formed of a silicon oxide film. Alternatively, the surface layer 122 may be omitted depending on a type of the transparent substrate 121.

The light blocking layer 123 is formed on the upper surface of the transparent substrate 121. The light blocking layer 123 may contact the surface layer 122. The light blocking layer 123 may include an absorbing material which absorbs light such as carbon black. The light absorbing material may prevent light generated in the light emitting devices 10*a*, 10*b*, and 10*c* from leaking at a region between the transparent substrate 121 and the light emitting devices 10*a*, 10*b*, and 10*c* toward a side surface thereof, and may improve contrast of the display apparatus.

As shown in FIG. 4C, the light blocking layer 123 may have windows 123*a*, 123*b*, and 123*c* for a light path, so that light generated in the light emitting devices 10*a*, 10*b*, and 10*c* is incident on the transparent substrate 121, and for this purpose, the light blocking layer 123 may be patterned to expose the transparent substrate 121. In some forms, widths of the windows 123*a*, 123*b*, and 123*c* may be narrower than those of the light emitting devices, but the inventive concepts are not limited thereto. In other forms, the widths of the windows 123*a*, 123*b*, and 123*c* may be larger than those of the light emitting devices 10*a*, 10*b*, and 10*c*, and accordingly, a gap between the light emitting devices 10*a* and the light blocking layer 123 may be formed.

The adhesive layer 125 is attached onto the transparent substrate 121. The adhesive layer 125 may cover the light blocking layer 123. The adhesive layer 125 may be attached onto an entire surface of the transparent substrate 121, but the inventive concepts are not limited thereto, and, in some exemplary embodiments, the adhesive layer 125 may be attached to a portion of the transparent substrate 121 to expose a region near an edge of the transparent substrate 121. The adhesive layer 125 is used to attach the light emitting devices 10*a*, 10*b*, and 10*c* to the transparent substrate 121. The adhesive layer 125 may fill the windows 123*a*, 123*b*, and 123*c* formed in the light blocking layer 123, as shown in FIG. 4C.

The adhesive layer 125 may be formed as a light-transmitting layer, and transmits light emitted from the light emitting devices 10*a*, 10*b*, and 10*c*. The adhesive layer 125 may be formed using an organic adhesive. For example, the adhesive layer 125 may be formed using a transparent epoxy. In addition, the adhesive layer 125 may include a diffuser such as $SiO_2$, $TiO_2$, ZnO, or the like to diffuse light. The light diffusing material prevents the light emitting devices 10*a*, 10*b* and 10*c* from being observed from the light exiting surface.

The first, second, and third light emitting devices 10*a*, 10*b*, and 10*c* are disposed on the transparent substrate 121. The first, second, and third light emitting devices 10*a*, 10*b*, and 10*c* may be attached to the transparent substrate 121 by the adhesive layer 125. The first, second, and third light emitting devices 10*a*, 10*b*, and 10*c* may be disposed to correspond to the windows 123*a*, 123*b*, and 123*c* of the light blocking layer 123.

The first, second, and third light emitting devices 10*a*, 10*b*, and 10*c* may be disposed on a flat surface of the adhesive layer 125 as illustrated in FIGS. 4B and 4C. The adhesive layer 125 may be disposed under lower surfaces of the light emitting devices 10*a*, 10*b*, and 10*c*. In another exemplary embodiment, the adhesive layer 125 may partially cover side surfaces of the first, second, and third light emitting devices 10*a*, 10*b*, and 10*c*.

The first, second, and third light emitting devices 10*a*, 10*b*, and 10*c* may be, for example, a red light emitting device, a green light emitting device, and a blue light emitting device. Since specific configurations of each of the first, second, and third light emitting devices 10*a*, 10*b*, and 10*c* are the same as those described with reference to FIG. 3A and FIG. 3B, detailed descriptions thereof will be omitted.

The first, second, and third light emitting devices 10*a*, 10*b*, and 10*c* may be arranged side by side to form a line, as illustrated in FIG. 4A. In particular, in a case that the transparent substrate 121 is a sapphire substrate, the sapphire substrate may include clean-cut surfaces (e.g., m-plane) and non clean-cut surfaces (e.g., a-plane) due to a location of a crystal plane along a cutting direction. For example, when the sapphire substrate is cut into a quadrangular shape, two cutting planes on both sides thereof (e.g., m-plane) may be cut cleanly along the crystal plane, and two remaining cutting planes (e.g., a-plane) disposed in a direction perpendicular to the cutting planes may not be cut cleanly. In this case, the clean-cut surfaces of the sapphire substrate 121 may be flush with an arrangement direction of the light emitting devices 10*a*, 10*b*, and 10*c*. For example, in FIG. 4A, the clean-cut surfaces (e.g., m-plane) may be disposed up and down, and the two remaining cut surfaces (e.g., a-plane) may be disposed left and right.

In addition, each of the first, second, and third light emitting devices 10*a*, 10*b*, and 10*c* may be arranged parallel to one another in a long axis direction. Short axis directions of the first, second, and third light emitting devices 10*a*, 10*b*, and 10*c* may coincide with arrangement directions of these light emitting devices.

The first, second, and third light emitting devices 10*a*, 10*b*, and 10*c* may be those described above with reference to FIG. 3A and FIG. 3B, but the inventive concepts are not limited thereto, and various light emitting devices having a lateral or flip chip structure may be used.

The step adjustment layer 127 covers the first, second, and third light emitting devices 10*a*, 10*b*, and 10*c* and the adhesive layer 125. The step adjustment layer 127 has openings 127*a* exposing the first and second electrode pads 61 and 63 of the light emitting devices 10*a*, 10*b*, and 10*c*. The step adjustment layer 127 assists to safely form the connection layers by uniformly adjusting elevations of surfaces on which the connection layers 129*a*, 129*b*, 129*c*, and 129*d* are formed. The step adjustment layer 127 may be formed of, for example, photosensitive polyimide.

The step adjustment layer 127 may be disposed in a region surrounded by an edge of the adhesive layer 125, but the inventive concepts are not limited thereto. For example, the step adjustment layer 127 may be formed to partially expose the edge of the adhesive layer 125.

A side surface of the step adjustment layer 127 may be inclined at an angle of 90 degrees or less with respect to an upper surface of the adhesive layer 125. For example, the side surface of the step adjustment layer 127 may have an inclination angle of about 60 degrees with respect to the upper surface of the adhesive layer 125.

The first, second, third, and fourth connection layers 129*a*, 129*b*, 129*c*, and 129*d* are formed on the step adjustment layer 127. The connection layers 129*a*, 129*b*, 129*c*, and 129*d* may be connected to the first and second electrode pads 61 and 63 of the first, second, and third light emitting devices 10*a*, 10*b*, and 10*c* through the openings 127*a* of the step adjustment layer 127.

In an exemplary embodiment, as illustrated in FIGS. 4A and 4B, the first connection layer 129*a* may be electrically connected to a second conductivity type semiconductor layer of the first light emitting device 10*a*, the second connection layer 129*b* may be electrically connected to a second conductivity of the second light emitting device 10*b*, the third connection layer 129*c* may be electrically connected to a second conductivity type semiconductor layer of the third light emitting device 10*c*, and the fourth connection layer 129*d* may be commonly electrically connected to first conductivity type semiconductor layers of the first, second, and third light emitting devices 10*a*, 10*b*, and 10*c*. In the present embodiment, the fourth connection layer 129*d* is a common connection layer commonly connected to the light emitting devices 10*a*, 10*b*, and 10*c*. The first, second, third, and fourth connection layers 129*a*, 129*b*, 129*c*, and 129*d* may be formed together on the step adjustment layer 127, and may include, for example, Au.

In another exemplary embodiment, the first connection layer 129*a* may be electrically connected to the first conductivity type semiconductor layer of the first light emitting device 10*a*, the second connection layer 129*b* may be electrically connected to the first conductivity type semiconductor layer of the second light emitting device 10*b*, the third connection layer 129*c* may be electrically connected to the first conductivity type semiconductor layer of the third light emitting device 10*c*, and the fourth connection layer 129*d* may be commonly electrically connected to the second conductivity type semiconductor layers of the first, second, and third light emitting devices 10*a*, 10*b*, and 10*c*. The first, second, third, and fourth connection layers 129*a*, 129*b*, 129*c*, and 129*d* may be formed together on the step adjustment layer 127.

The insulation material layer 131 may be formed to have a thickness smaller than that of the step adjustment layer 127. A sum of the thicknesses of the insulation material layer 131 and the step adjustment layer 127 may be about 1 μm or more and 50 μm or less, but the inventive concepts are not limited thereto. Meanwhile, a side surface of the insulation material layer 131 may have an inclination angle of 90 degrees or less, for example, about 60 degrees with respect to the upper surface of the adhesive layer 125.

The insulation material layer 131 covers side surfaces of the step adjustment layer 127 and the connection layers 129*a*, 129*b*, 129*c*, and 129*d*, as shown in FIG. 4C. In addition, the insulation material layer 131 may cover a portion of the adhesive layer 125. The insulation material layer 131 may have openings 131*a*, 131*b*, 131*c*, and 131*d* exposing the connection layers 129*a*, 129*b*, 129*c*, and 129*d*, and accordingly, pad regions of the unit pixel 100 may be defined.

In an exemplary embodiment, the insulation material layer 131 may be a translucent material, and may be formed of an organic or inorganic material. The insulation material layer 131 may be formed of, for example, polyimide. When the insulation material layer 131 along with the step adjustment layer 127 is formed of polyimide, all of lower, side, and upper surfaces of the connection layers 129*a*, 129*b*, 129*c*, and 129*d* may be surrounded by the polyimide, except for the pad regions.

Meanwhile, the unit pixel 100 may be mounted on a circuit board using a bonding material such as solder, and the bonding material may bond the connection layers 129*a*, 129*b*, 129*c*, and 129*d* exposed to the openings 131*a*, 131*b*, 131*c*, and 131*d* of the insulation material layer 131 to pads on the circuit board.

According to the illustrated exemplary embodiment, the unit pixel 100 does not include separate bumps, and the connection layers 129*a*, 129*b*, 129*c*, and 129*d* are used as bonding pads. However, the inventive concepts are not limited thereto, and bonding pads covering the openings 131*a*, 131*b*, 131*c*, and 131*d* of the insulation material layer 131 may be formed. In an exemplary embodiment, the bonding pads may be formed to partially cover the light emitting devices 10*a*, 10*b*, and 10*c* outside of upper regions of the first, second, third, and fourth connection layers 129*a*, 129*b*, 129*c*, and 129*d*.

In the illustrated exemplary embodiment, the light emitting devices 10*a*, 10*b*, and 10*c* are described as being attached to the transparent substrate 121 by the adhesive layer 125, but the light emitting devices 10*a*, 10*b*, and 10*c* may be coupled to the transparent substrate 121 using another coupler instead of the adhesive layer 125. For example, the light emitting devices 10*a*, 10*b*, and 10*c* may be coupled to the transparent substrate 121 using spacers, and thus, gas or liquid may be filled in a region between the light emitting devices 10*a*, 10*b*, and 10*c* and the transparent substrate 121. An optical layer that transmits light emitted from the light emitting devices 10*a*, 10*b*, and 10*c* may be formed by the gas or liquid. The adhesive layer 125 described above is also an example of the optical layer. Herein, the optical layer is formed of a material such as gas, liquid, or solid, different from those of the light emitting devices 10*a*, 10*b*, and 10*c*, and thus, is distinguished from the materials of the semiconductor layers in the light emitting devices 10*a*, 10*b*, and 10*c*.

Figure 5A:
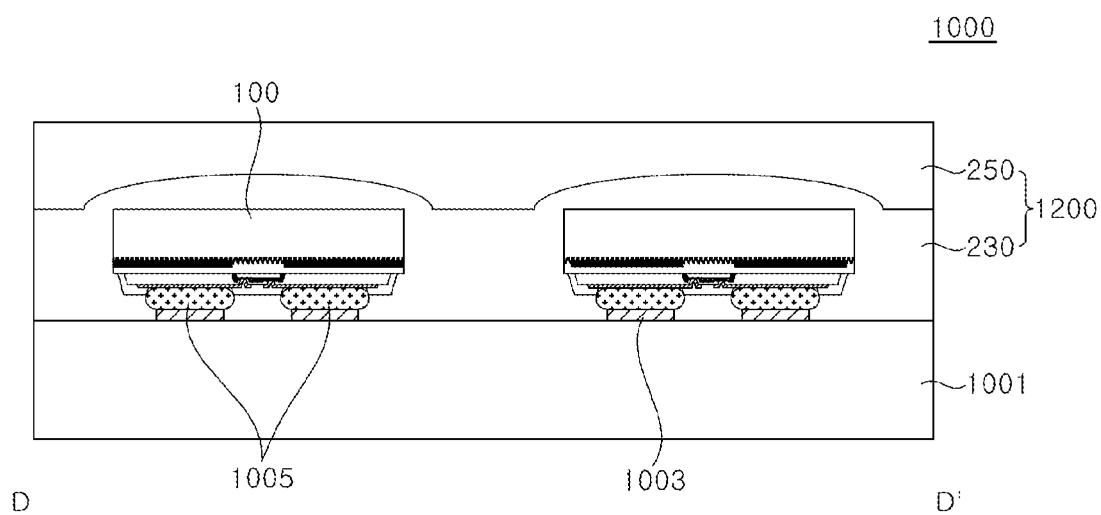
FIG. 5A is a schematic partial cross-sectional view taken along line D-D' of FIG. 2 to illustrate the pixel module according to an exemplary embodiment.
Figure 5B:
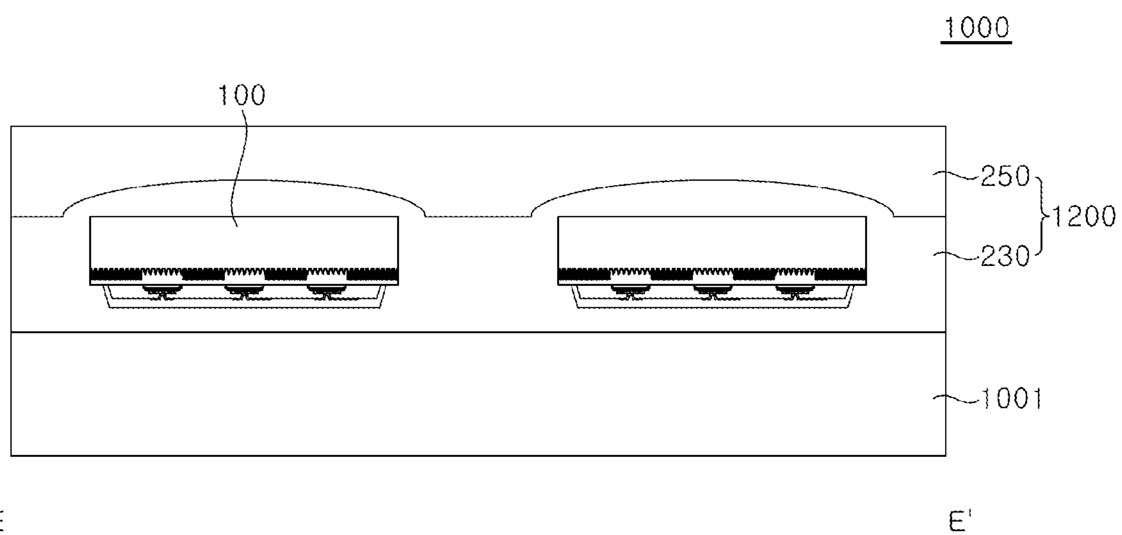
FIG. 5B is a schematic partial cross-sectional view taken along line E-E' of FIG. 2 to illustrate the pixel module according to an exemplary embodiment.

FIG. 5A is a schematic partial cross-sectional view taken along line D-D' of FIG. 2 to illustrate the pixel module 1000 according to an exemplary embodiment, and FIG. 5B is a schematic partial cross-sectional view taken along line E-E' of FIG. 2.

Referring to FIGS. 5A and 5B, the pixel module 1000 includes a circuit board 1001 and unit pixels 100 arranged on the circuit board 1001. The pixel module 1000 may further include a molding member 1200 covering the unit pixels 100.

The circuit board 1001 may have a circuit for electrically connecting a panel substrate 2100 and light emitting devices 10*a*, 10*b*, and 10*c*. The circuit in the circuit board 1001 may be formed to have a multilayer structure. The circuit board 1001 may also include a passive circuit for driving the light emitting devices 10*a*, 10*b*, and 10*c* in a passive matrix driving manner or an active circuit for driving the light emitting devices 10*a*, 10*b*, and 10*c* in an active matrix driving manner. The circuit board 1001 may include pads 1003 exposed on a surface thereof.

Since a detailed configuration of the unit pixels 100 is the same as that described with reference to FIGS. 4A, 4B, and 4C, detailed descriptions thereof will be omitted to avoid redundancy. The unit pixels 100 may be arranged on the circuit board 1001. The unit pixels 100 may be arranged in various matrices such as 2×2, 2×3, 3×3, 4×4, 5×5, or the like.

The unit pixels 100 may be bonded to the circuit board 1001 by a bonding material 1005. For example, the bonding material 1005 bonds the connection layers 129*a*, 129*b*, 129*c*, and 129*d* exposed through the openings 131*a*, 131*b*, 131*c*, and 131*d* of the insulation material layer 131 to the pads 1003 on the circuit board 1001, as described with reference to FIGS. 4A, 4B, and 4C. The bonding material 1005 may be, for example, solder, and after a solder paste is disposed on the pads 1003 using a technique such as screen printing, may bond the unit pixel 100 and the circuit board 1001 through a reflow process. In some forms, the pads 1003 on the circuit board 1001 may protrude above an upper surface of the circuit board 1001, but in other forms, the pads 1003 may be disposed below the upper surface of the circuit board 1001.

According to the illustrated exemplary embodiment, the bonding material 1005 of a single structure is disposed between the connection layers 129*a*, 129*b*, 129*c*, and 129*d* and the pads 1003, and the bonding material 1005 may directly connect the connection layers 129*a*, 129*b*, 129*c*, and 129*d* and the pads 1003.

The molding member 1200 covers a plurality of unit pixels 100. A total thickness of the molding member 1200 may be in a range of about 150 μm to about 350 μm. The molding member 1200 may include a light diffusion layer 230 and a black molding layer 250. The light diffusion layer 230 may include a transparent matrix such as an epoxy molding compound and light diffusion particles dispersed in the transparent matrix. The light diffusion particles may be, for example, silica or $TiO_2$, but the inventive concepts are not limited thereto. The molding member 1200 may have a thickness in a range of, for example, about 50 μm to about 200 μm, and the light diffusion particles may be included in the molding member 1200 within a range of, for example, about 0.2% to 10% by weight based on a total weight of the molding member 1200. The light diffusion layer 230 diffuses light emitted from the light emitting devices 10*a*, 10*b*, and 10*c*. The light diffusion layer 230 assists to uniformly mix light of different colors emitted from the unit pixel 100 and also prevents light emitted to a side surface of the unit pixel 100 from emitting to the outside of the pixel module 1000.

The black molding layer 250 includes a material that absorbs light in the matrix. The matrix may be, for example, a dry-film type solder resist (DFSR), a photoimageable solder resist (PSR), or an epoxy molding compound (EMC), but the inventive concepts are not limited thereto. The light absorbing material may include a light absorbing dye such as carbon black. The light absorbing dye may be directly dispersed in the matrix, or may be coated on a surface of organic or inorganic particles and dispersed in the matrix. Various kinds of organic or inorganic particles may be used to coat the light absorbing material. For example, $TiO_2$ or silica particles coated with carbon black may be used. The black molding layer 250 may be formed to have a thickness in a range of about 50 μm to about 200 μm. Light transmittance of the black molding layer 250 may be adjusted by adjusting a concentration of the light absorbing material contained in the black molding layer 250. The light absorbing material may be in a range of about 0.05% to about 10% by weight based on a total weight of the matrix.

The black molding layer 250 may be formed as a single layer in which the light absorbing material is uniformly dispersed, but the inventive concepts are not limited thereto. The black molding layer 250 may be formed of a plurality of layers having different concentrations of light absorbing materials from one another. For example, the black molding layer 250 may include two layers having different concentrations of light absorbing materials from each other. In this case, a first layer close to the light diffusion layer 230 may contain more light absorbing material than a second layer. Since a light absorption rate of the first layer is set to be higher than that of the second layer, a total absorption amount of light emitted upward from the unit pixel 100 may be reduced, and thus, luminance of the pixel module 1000 may be increased.

In an exemplary embodiment, when the black molding layer 250 is formed into the plurality of layers, these layers may have distinct boundaries to one another. For example, after layers having different concentrations of the light absorbing material from one another are individually manufactured as a film, the black molding layer 250 may be manufactured by sandwiching the films. Alternatively, the black molding layer 250 may be formed by continuously printing layers having different concentrations of the light absorbing material from one another. In another exemplary embodiment, the black molding layer 250 may be formed such that the concentration of the light absorbing material gradually decreases in a thickness direction.

Light vertically incident from the unit pixels 100 passes through the black molding layer 250 easily because a light path passing through the black molding layer 250 is short, but light incident with an inclination angle is mostly absorbed by the black molding layer 250 because a light path passing through the black molding layer 250 is long. As such, the black molding layer 250 prevents optical interference between the unit pixels 100, and thus, contrast of the display apparatus may be improved, thereby further reducing color deviation.

The molding member 1200 may be formed using technology, for example, lamination, spin coating, slit coating, printing, or the like. For example, the molding member 1200 may be formed on the unit pixels 100 by vacuum lamination technology after the light diffusion layer 230 and the black molding layer 250 are constricted.

A display apparatus 10000 may be provided by mounting the pixel modules 1000 as illustrated in FIG. 5A and FIG. 5B, on the panel substrate 2100 of FIG. 1. The circuit board 1001 has bottom pads connected to the pads 1003. The bottom pads may be arranged in a one-to-one correspondence with the pads 1003, but the number of the bottom pads may be reduced through a common connection.

In the illustrated exemplary embodiment, the display apparatus 10000 is provided as the unit pixels 100 are formed into the pixel module 1000, and the pixel modules 1000 are mounted on the panel substrate 2100, and thus, a process yield of the display apparatus may be improved. However, the inventive concepts are not limited thereto, and the unit pixels 100 may be directly mounted on the panel substrate 2100.

Meanwhile, the unit pixels 100 may prevent physical damage of the light emitting devices 10*a*, 10*b*, and 10*c*, but the unit pixels 100 are still vulnerable to electrostatic discharge. While the pixel module 1000 is manufactured using the unit pixels 100 or the display apparatus 10000 is manufactured, static electricity generated from a machine or a human body may destroy the light emitting devices 10*a*, 10*b*, and 10*c*, and thus, reliability of the light emitting devices 10*a*, 10*b*, and 10*c* may be affected. Mainly, high voltage static electricity damages an electrode connection part by instantaneous energization, or damages weak parts such as threading dislocations inside the light emitting devices 10*a*, 10*b*, and 10*c*, which deteriorates electrical characteristics. Such deterioration of electrical characteristics may occur immediately during a display apparatus manufacturing operation, or may progress to a failure during use of the display apparatus over time. Therefore, there is a need to prevent direct damage or potential damage to the light emitting devices 10*a*, 10*b*, and 10*c* due to electrostatic discharge.

Hereinafter, exemplary embodiments of unit pixels for protecting the light emitting devices 10*a*, 10*b*, and 10*c* from electrostatic discharge by adding an electrostatic discharge protector to the previous unit pixels 100 will be described in detail.

Figure 6A:
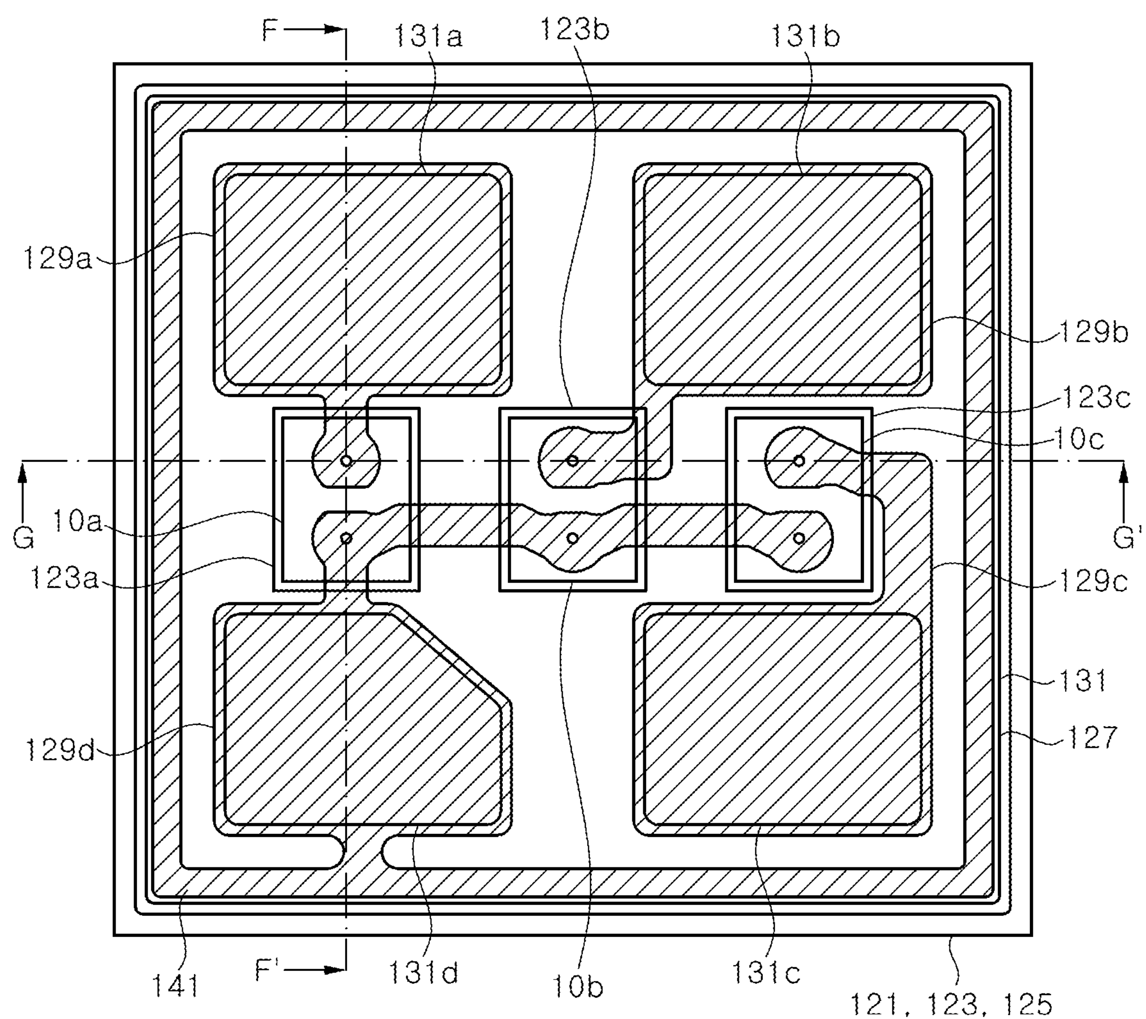
FIG. 6A is a schematic plan view illustrating a unit pixel according to another exemplary embodiment.
Figure 6B:
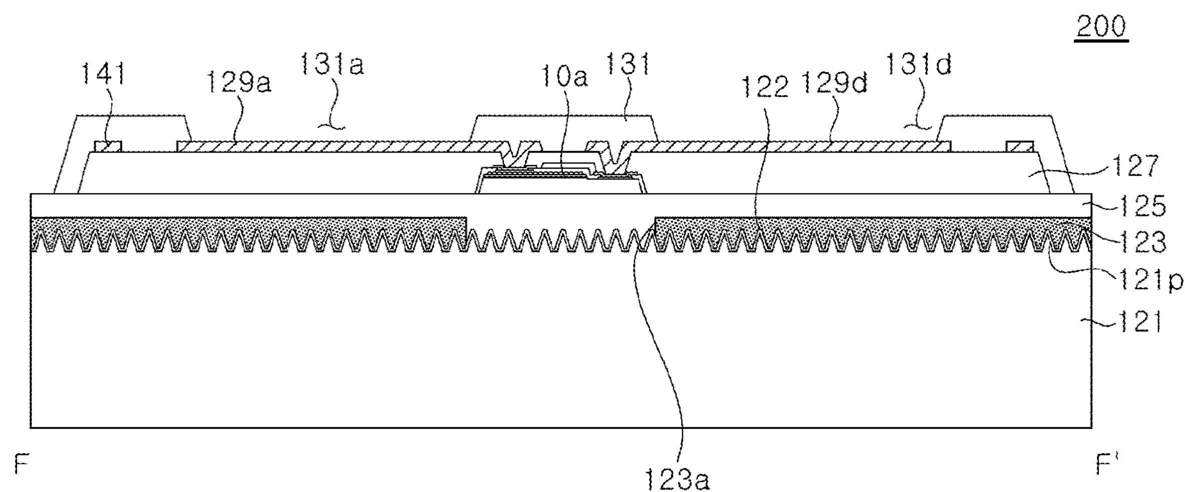
FIG. 6B is a schematic cross-sectional view taken along line F-F' of FIG. 6A.
Figure 6C:
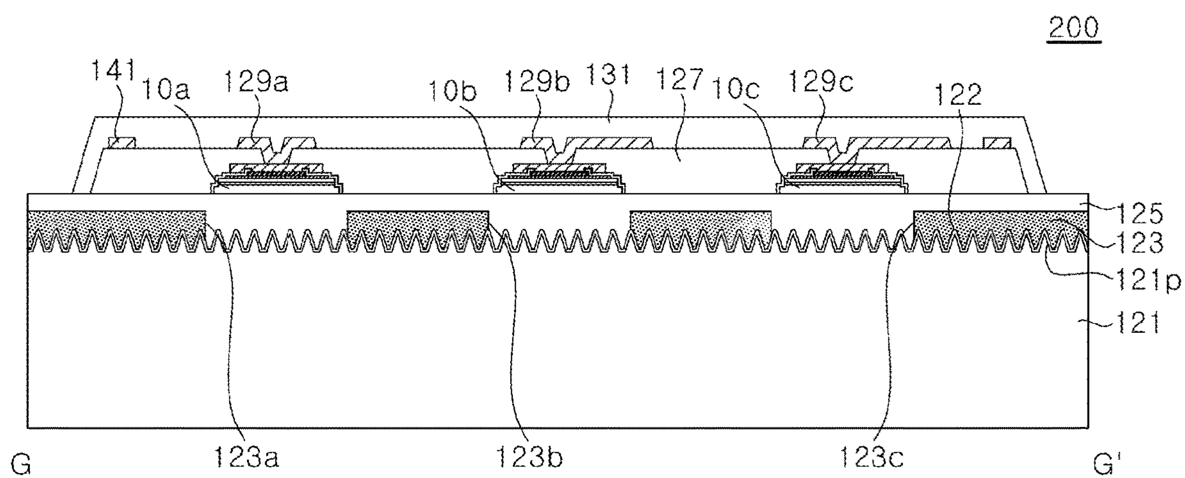
FIG. 6C is a schematic cross-sectional view taken along line G-G' of FIG. 6A.

FIG. 6A is a schematic plan view illustrating a unit pixel 200 according to another exemplary embodiment, FIG. 6B is a schematic cross-sectional view taken along line F-F' of FIG. 6A, and FIG. 6C is a schematic cross-sectional view taken along line G-G' of FIG. 6A.

Referring to FIGS. 6A, 6B, and 6C, the unit pixel 200 is substantially similar to the unit pixel 100 described with reference to FIGS. 4A, 4B, and 4C, but a conductive line 141 connected to a connection layer 129*d* is further included in the unit pixel 200.

The conductive line 141 may be formed together with connection layers 129*a*, 129*b*, 129*c*, and 129*d*, and may be formed of an identical metallic material as the connection layers. However, the inventive concepts are not necessarily limited thereto, and may be formed through a process different from that of the connection layers 129*a*, 129*b*, 129*c*, and 129*d*, and may also be formed of a different conductive material. The conductive line 141 may be covered with an insulation material layer 131 like the connection layers 129*a*, 129*b*, 129*c*, and 129*d*. However, the inventive concepts are not limited thereto, and the conductive line 141 may be exposed to the outside of the unit pixel 200.

The conductive line 141 may surround the light emitting devices 10*a*, 10*b*, and 10*c*, and further, may surround the connection layers 129*a*, 129*b*, 129*c*, and 129*d*, that is, pad regions. As illustrated in FIG. 6A, the conductive line 141 may be disposed along an edge of the unit pixel 200.

In an exemplary embodiment, the conductive line 141 is connected to the connection layer 129*d* electrically connected to first conductive type semiconductor layers 21 of the light emitting devices 10*a*, 10*b*, and 10*c*. As described above with reference to FIGS. 3A and 3B, first contact pads 53 are disposed on the first conductivity type semiconductor layers 21 of the light emitting devices 10*a*, 10*b*, and 10*c*. The connection layer 129*d* may be electrically connected to first contact pads 53 to be commonly electrically connected to the first conductivity type semiconductor layers 21.

Static electricity has a high voltage, but its current is relatively low, and thus, it can be controlled through a detour. In particular, a failure due to electrostatic discharge occurs near a second contact pad 55 and does not occur near the first contact pad 53. Accordingly, by providing the detour to the connection layer 129*d* using the conductive line 141 before the current due to static electricity flows through the second contact pad 55, damage to the light emitting devices 10*a*, 10*b*, and 10*c* caused by static electricity may be prevented.

As such, since the conductive line 141 is connected to the connection layer 129*d* commonly electrically connected to the first conductivity type semiconductor layers 21, the detour for static electricity is provided, and thus, the light emitting devices 10*a*, 10*b*, and 10*c* may be protected.

In another exemplary embodiment, the connection layer 129*d* may be commonly electrically connected to second conductivity type semiconductor layers 25, instead of the first conductivity type semiconductor layers 21, and the conductive line 141 may be connected to the connection layer 129*d* commonly electrically connected to the second conductivity type semiconductor layers 25 of the light emitting devices 10*a*, 10*b*, and 10*c*.

In the illustrated exemplary embodiment, as the conductive line 141 for preventing electrostatic discharge is disposed along the edge of the unit pixel 200, the conductive line 141 may be used as a buffer for electrostatic discharge.

Figure 7A:
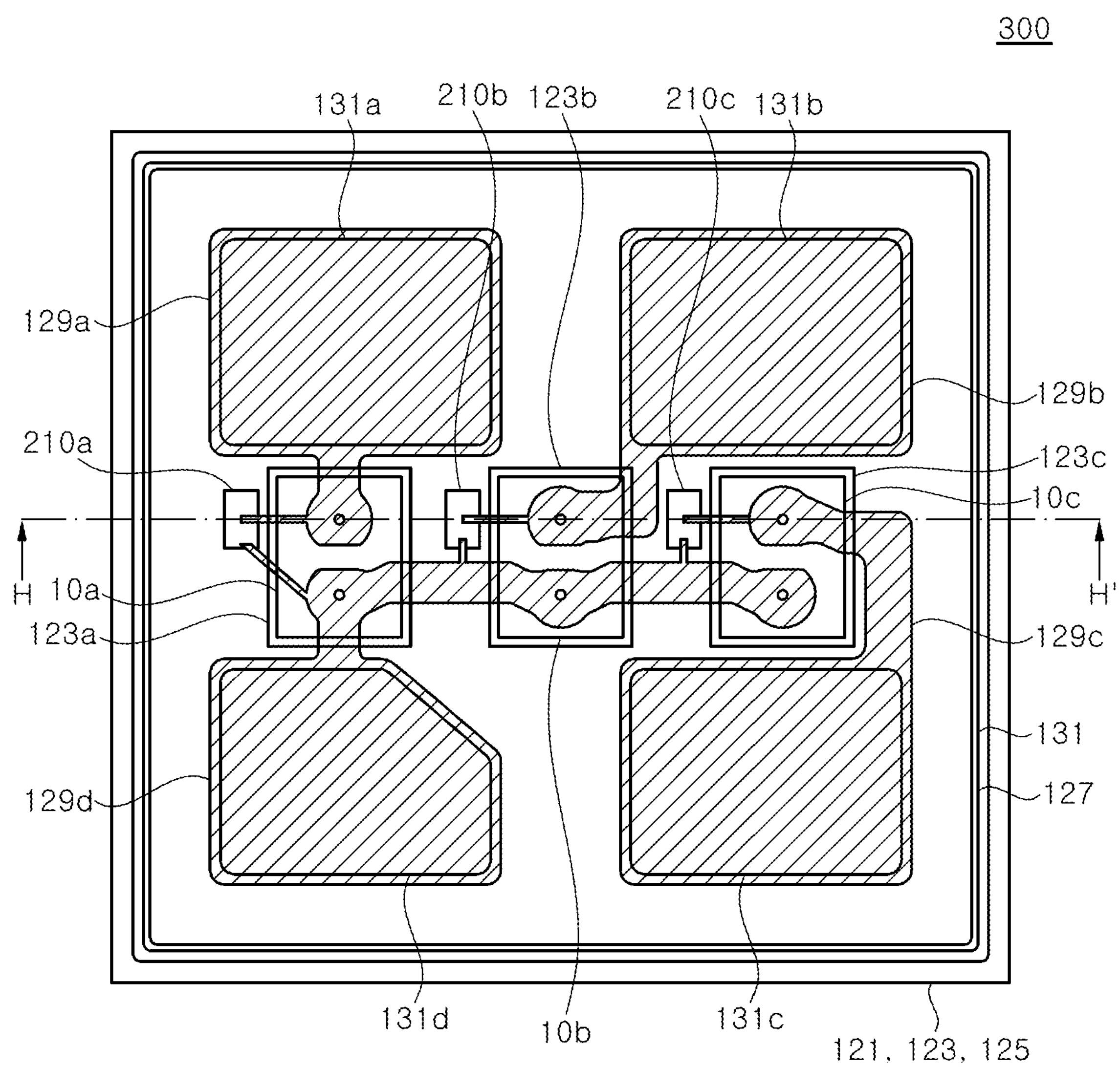
FIG. 7A is a schematic plan view illustrating a unit pixel according to another exemplary embodiment.
Figure 7B:
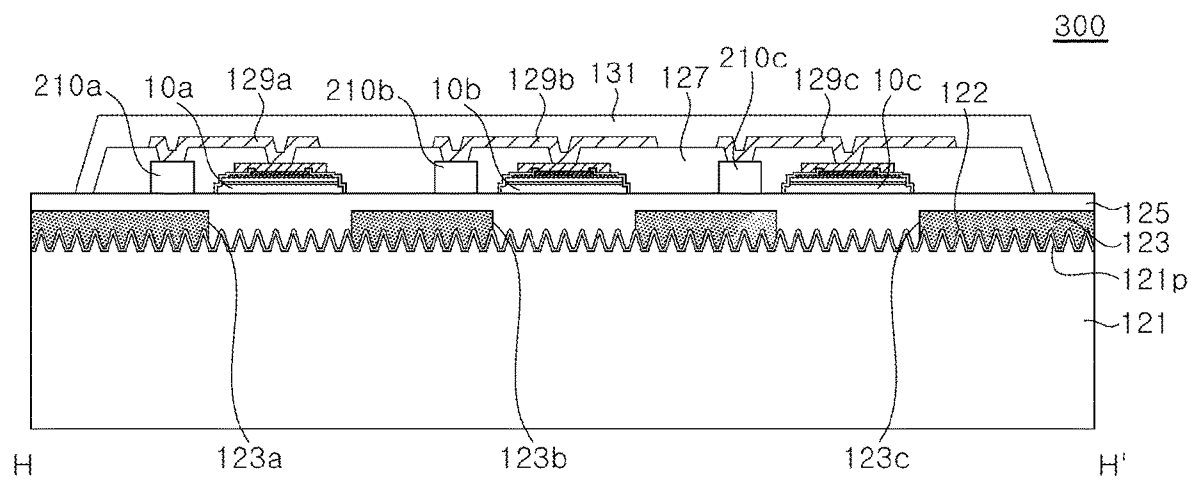
FIG. 7B is a schematic cross-sectional view taken along line H-H' of FIG. 7A.

FIG. 7A is a schematic plan view illustrating a unit pixel 300 according to another exemplary embodiment, and FIG. 7B is a schematic cross-sectional view taken along line H-H' of FIG. 7A.

Referring to FIGS. 7A and 7B, the unit pixel 300 is substantially similar to the unit pixel 100 described with reference to FIGS. 4A, 4B, and 4C, but Zener diodes 210*a*, 210*b*, and 210*c* are electrically connected to the light emitting devices 10*a*, 10*b*, and 10*c*, respectively.

The Zener diode 210*a* may be located near the light emitting device 10*a* to be electrically connected to a connection layer 129*a* and a connection layer 129*d*, the Zener diode 210*b* may be located near the light emitting device 10*b* to be electrically connected to a connection layer 129*b* and the connection layer 129*d*, and the Zener diode 210*c* may be located near the light emitting device 10*c* to be electrically connected to a connection layer 129*c* of FIG. 7A and the connection layer 129*d*.

After the light emitting devices 10_a_, 10_b_, and 10_c_ are attached on an adhesive layer 125, the Zener diodes 210_a_, 210_b_, and 210_c_ may be attached to the adhesive layer 125. In one form, by arranging the Zener diodes 210_a_, 210_b_, and 210_c_ on an identical line as the light emitting devices 10_a_, 10_b_, and 10_c_ at equal intervals, a transferring process of the light emitting devices 10_a_, 10_b_, and 10_c_ and the Zener diodes 210_a_, 210_b_, and 210_c_ may be easily carried out. Thereafter, the light emitting devices 10_b_, and 10_c_ and the Zener diodes 210_a_, 210_b_, and 210_c_ may be electrically connected to one another.

The Zener diodes 210_a_, 210_b_, and 210_c_ are disposed at a predetermined distance from the light emitting devices 10_a_, 10_b_, and 10_c_ so as not to absorb or block light emitted from the light emitting devices 10_a_, 10_b_, and 10_c_.

Meanwhile, the Zener diodes 210_a_, 210_b_, and 210_c_ may be disposed near the light emitting devices 10_a_, 10_b_, and 10_c_, respectively, but the inventive concepts are not limited thereto. In another form, the Zener diodes may be limitedly disposed near light emitting devices that are relatively vulnerable to electrostatic discharge. For example, as the light emitting device 10_a_ emitting red light is strong against electrostatic discharge, the Zener diode 210_a_ disposed near the light emitting device 10_a_ may be omitted.

Figure 8:
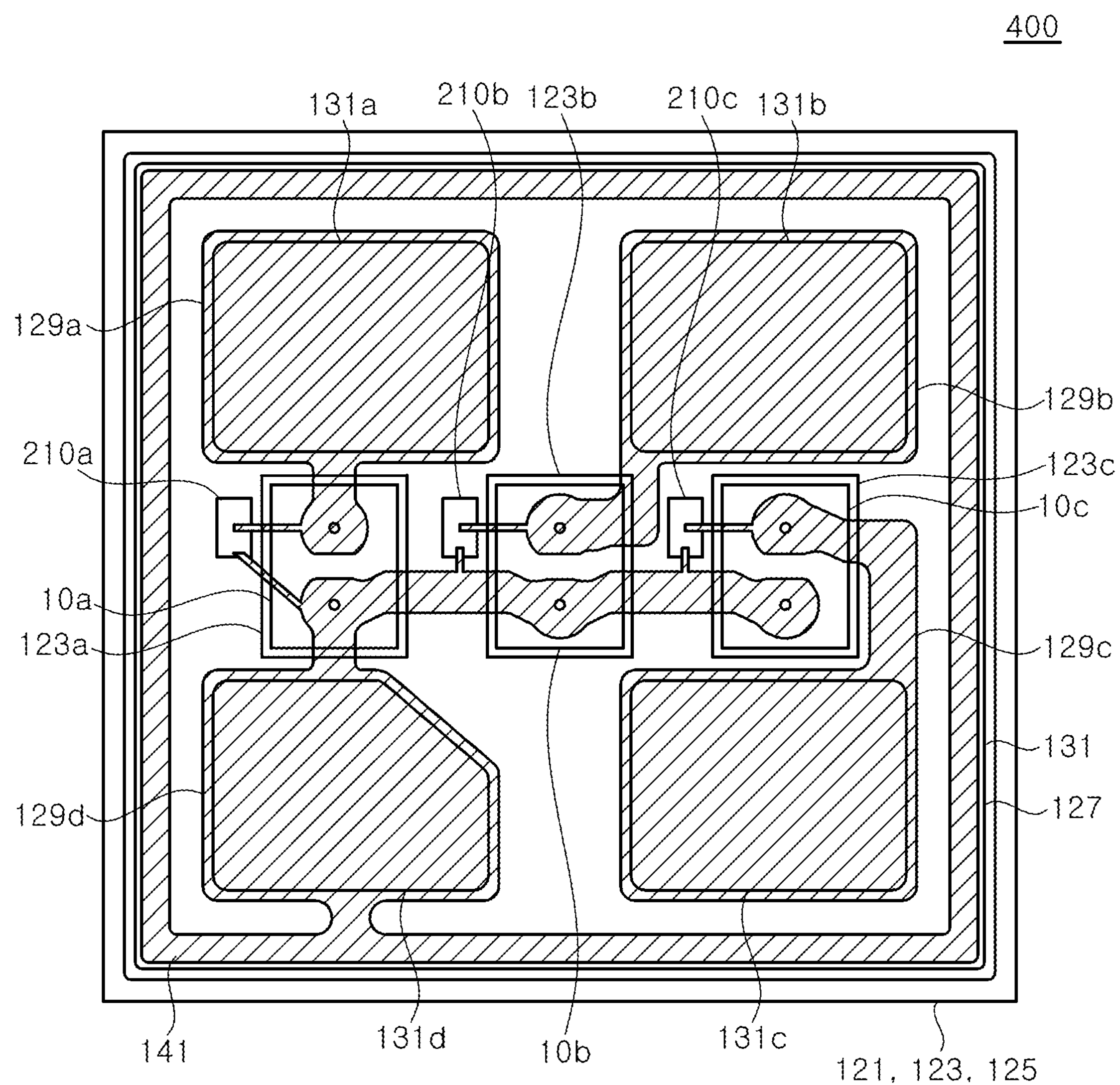
FIG. 8 is a schematic plan view illustrating a unit pixel according to another exemplary embodiment.

FIG. 8 is a schematic plan view illustrating a unit pixel 400 according to another exemplary embodiment.

Referring to FIG. 8, the unit pixel 400 is substantially similar to the unit pixel 100 described with reference to FIGS. 4A, 4B, and 4C, but a conductive line 141 and Zener diodes 210_a_, 210_b_, and 210_c_ are added.

Since the conductive line 141 is the same as that described with reference to FIGS. 6A, 6B, and 6C, and the Zener diodes 210_a_, 210_b_, and 210_c_ are the same as those described with reference to FIGS. 7A and 7B, detailed descriptions thereof are omitted to avoid redundancy.

Since the conductive line 141 and the Zener diodes 210_a_, 210_b_, 210_c_, and 210_d_ are included together, the light emitting diodes 10_a_, 10_b_, and 10_c_ may be further protected from electrostatic discharge.

Figure 9:
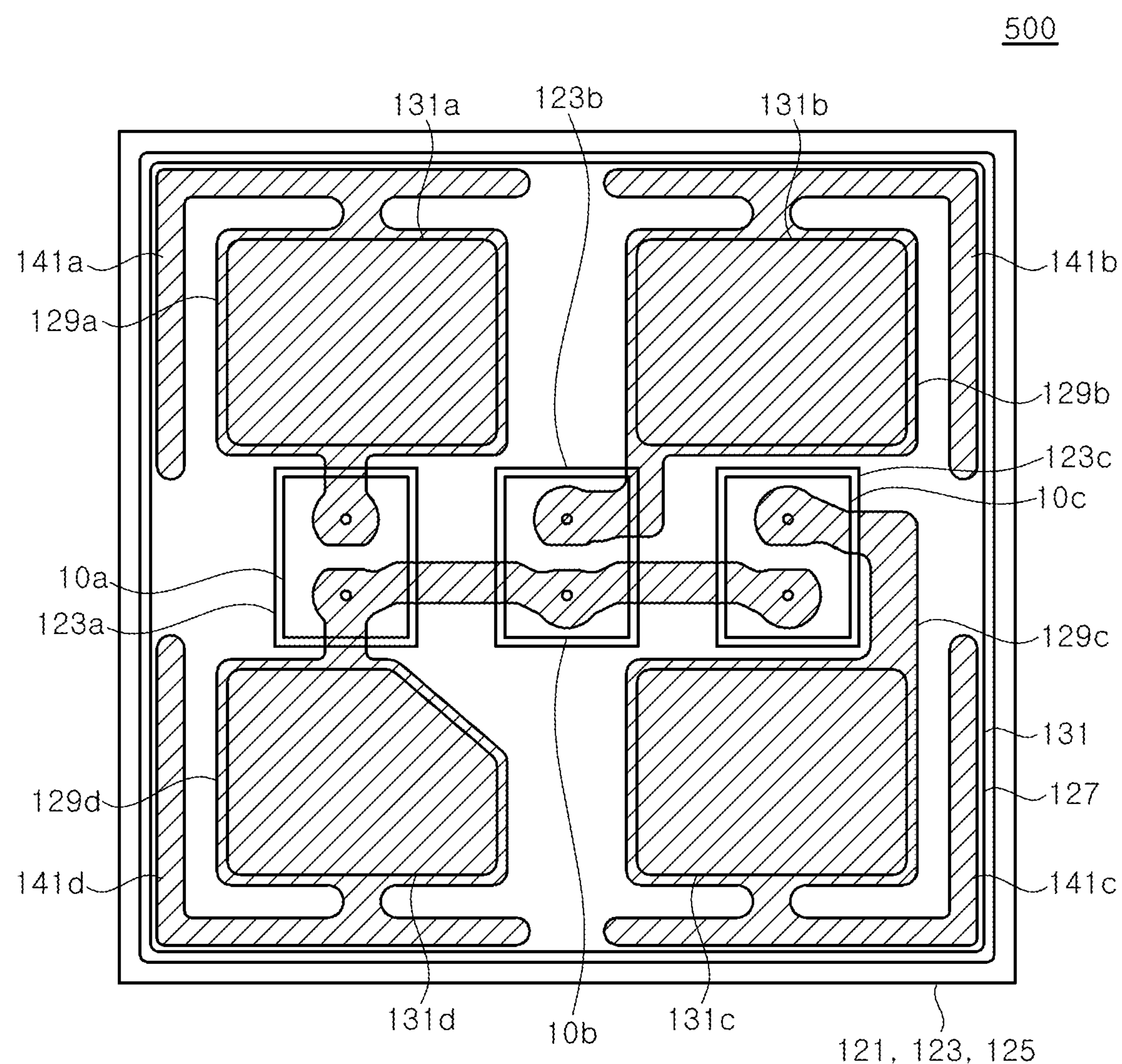
FIG. 9 is a schematic plan view illustrating a unit pixel according to further another exemplary embodiment.

FIG. 9 is a schematic plan view illustrating a unit pixel 500 according to another exemplary embodiment.

Referring to FIG. 9, the unit pixel 500 is substantially similar to the unit pixel 100 described with reference to FIGS. 4A, 4B, and 4C, but conductive lines 141_a_, 141_b_, 141_c_, and 141_d_ are connected to connection layers 129_a_, 129_b_, 129_c_, and 129_d_, respectively.

The conductive lines 141_a_, 141_b_, 141_c_, and 141_d_ may be formed together with the connection layers 129_a_, 129_b_, 129_c_, and 129_d_. However, the inventive concepts are not limited thereto. The conductive lines 141_a_, 141_b_, 141_c_, and 141_d_ may also be covered with an insulation material layer 131 like the connection layers 129_a_, 129_b_, 129_c_, and 129_d_. However, the inventive concepts are not limited thereto, and the conductive lines 141_a_, 141_b_, 141_c_, and 141_d_ may be exposed to the outside.

The conductive line 141_a_ is connected to the connection layer 129_a_, the conductive line 141_b_ is connected to the connection layer 129_b_, the conductive line 141_c_ is connected to the connection layer 129_c_, and the conductive line 141_d_ is connected to the connection layer 129_d_. The conductive lines 141_a_, 141_b_, 141_c_, and 141_d_ are spaced apart from one another. As the conductive lines 141_a_, 141_b_, 141_c_, and 141_d_ are connected to pad regions formed by the connection layers 129_a_, 129_b_, 129_c_, and 129_d_, respectively, the light emitting devices 10_a_, 10_b_, and 10_c_ may be protected.

In addition, Zener diodes 210_a_, 210_b_, and 210_c_ as described with reference to FIGS. 7A and 7B may be added near the light emitting devices 10_a_, 10_b_, and 10_c_.

Although some exemplary embodiments have been described herein, it should be understood that these exemplary embodiments are provided for illustration only and are not to be construed in any way as limiting the present disclosure. It should be understood that features or components of one exemplary embodiment can also be applied to other exemplary embodiments without departing from the spirit and scope of the present disclosure.

What is claimed is:

1. A light emitting device, comprising:

a substrate;

a plurality of light emitters disposed on the substrate, the plurality of light emitters arranged in a matrix having one or more rows and one or more columns, each light emitter comprising a first type semiconductive layer, a second type semiconductive layer, and an active layer disposed between the first type semiconductive layer and the second type semiconductive layer;

multiple sets of connection layers, each set of connection layers including a first electrode electrically connected to the first type semiconductive layer and a second electrode electrically connected to the second type semiconductive layer; and a plurality of electrostatic discharge (ESD) protectors disposed on the substrate, each ESD protector associated with a corresponding light emitter, wherein the plurality of light emitters comprises a blue light emitter, a green light emitter, and a red light emitter, wherein the plurality of ESD protectors comprises a first ESD protector, a second ESD protector, and a third ESD protector, and wherein the first ESD protector shares a set of connection layers connected to the blue light emitter, the second ESD protector shares a set of connection layers connected to the green light emitter, and the third ESD protector shares a set of connection layers connected to the red light emitter.

2. The light emitting device of claim 1, wherein at least one of the plurality of ESD protector is structured to arrange a continuous conductive line to extend along an internal edge of the substrate, the conductive line having a predetermined width.

3. The light emitting device of claim 2, wherein the conductive line is spaced apart from the plurality of light emitters and surrounds all of the plurality of light emitters.

4. The light emitting device of claim 2, wherein:

the conductive line is electrically connected to at least one connection layer which is electrically connected to one of the plurality of light emitters.

5. The light emitting device of claim 4, wherein the conductive line surrounds all of connection layers which surround the plurality of light emitters.

6. The light emitting device of claim 5, wherein:

the conductive line is electrically coupled to the at least one connection layer which is electrically connected to a first type semiconductive layer of a light emitter, or a second type semiconductive layer of the light emitter.

7. The light emitting device of claim 6, wherein the at least one connection layer is electrically connected to first type semiconductive layers of the plurality of light emitters.

8. The light emitting device of claim 1, wherein:
the ESD protector includes a plurality of conductive lines, each conductive line is arranged to be associated with both one of the plurality of light emitters and one of the connection layers, each conductive line is electrically connected to the connection layers, respectively.

9. A light emitting module, comprising:
a substrate;
a plurality of light emitters disposed on the substrate, the plurality of light emitters arranged in a matrix having one or more rows and one or more columns, each light emitter comprising a first type semiconductive layer, a second type semiconductive layer, and an active layer disposed between the first type semiconductive layer and the second type semiconductive layer;
a plurality of a set of connection layers, each set of connection layers associated with each light emitter and including a first electrode electrically connected to the first type semiconductive layer and a second electrode electrically connected to the second type semiconductive layer; and
a plurality of electrostatic discharge (ESD) protectors disposed on the substrate, each ESD protectors associated with each light emitter;
wherein:
the ESD protector includes at least three Zener diodes; and
at least one Zener diode is associated with and disposed adjacent to one or more light emitters and electrically connected to each associated light emitter.

10. The light emitting module of claim 9,
wherein at least one connection layer is electrically connected to the at least one Zener diode.

11. The light emitting module of claim 9,
wherein at least one of the plurality of ESD protectors further includes a continuous conductive line extending along an internal edge of the substrate, the conductive line having a predetermined width.

12. The light emitting module of claim 11, wherein:
the conductive line is electrically connected to the at least one connection layer at a first location on the substrate, and
the at least one Zener diode is electrically connected to the at least one connection layer at a second location on the substrate which is different from the first location.

13. The light emitting module of claim 12,
wherein the conductive line surrounds connection layers, the at least one Zener diodes, and three light emitters on the substrate.

14. The light emitting module of claim 9, wherein:
the at least one Zener diode is attached to an adhesive layer on which each light emitter is attached such that the at least one Zener diode and the three light emitters are arranged on a surface of the adhesive layer and each connection layer is electrically coupled to the at least one Zener diode and the three light emitters.

15. The light emitting module of claim 9, wherein:
the at least one Zener diode further includes a first Zener diode and a second Zener diode; and
the first Zener diode is disposed at a first predetermined distance from a blue light emitter and the second Zener diode is disposed at a second predetermined distance from a green light emitter.

16. The light emitting module of claim 9, wherein:
the plurality of light emitters further includes a first light emitter, a second light emitter, and a third light emitter; and
at least one of the plurality of ESD protectors further includes a plurality of conductive lines, each of the plurality of conductive lines associated with the first light emitter, the second light emitter, and the third light emitter, respectively, and electrically connected to each corresponding connection layer.

17. A display apparatus, comprising:
a circuit board and a light emitting module disposed on the circuit board,
wherein the light emitting module includes:
a substrate;
a plurality of light emitters disposed on the substrate, and including a blue light emitter, a green light emitter, and a red light emitter;
connection layers electrically connected to the plurality of light including a first connection layer electrically connected to the blue light emitter, a second connection layer electrically connected to the green light emitter, and a third connection layer electrically connected to the red light emitter; and
a plurality of electrostatic discharge (ESD) protectors disposed on the substrate, and including a first ESD protector, a second ESD protector, and a third ESD protector,
wherein the first ESD protector, the second ESD protector, and the third ESD protector are electrically connected to the first connection layer, the second connection layer, and the third connection layer, respectively.

18. The display apparatus of claim 17,
wherein the first ESD protector includes a conductive line extending along an edge of the substrate, the conductive line having a predetermined width and a continuous configuration or discrete segments.

19. The display apparatus of claim 18,
wherein the conductive line is electrically connected to the plurality of light emitters via a common connection layer electrically connected to the first connection layer, the second connection layer, and the third connection layer.

20. The display apparatus of claim 17, wherein:
the first ESD protector further includes a Zener diode.

* * * * *